Dec. 9, 1969 T. CSAKVARY 3,483,442

ELECTRICAL CONTACT FOR A HARD SOLDER ELECTRICAL DEVICE

Filed Aug. 24, 1967 2 Sheets-Sheet 1

United States Patent Office 3,483,442
Patented Dec. 9, 1969

3,483,442

ELECTRICAL CONTACT FOR A HARD SOLDER ELECTRICAL DEVICE

Tibor Csakvary, Greensburg, Pa., assignor to Westinghouse Electric Corporation, Pittsburgh, Pa., a corporation of Pennsylvania Filed Aug. 24, 1967, Ser. No. 663,023
Int. Cl. H01l *3/00, 5/00*
U.S. Cl. 317—234 4 Claims

ABSTRACT OF THE DISCLOSURE

Electrical conducting means are hard soldered to a semiconductor element comprising a body of silicon semiconductor material. The surface area of a region to which an electrical conducting means is to be affixed by hard solder is oxidized to form a layer of silicon oxide 100 A. units to 150 A. units in thickness. A layer of either manganese, titanium or vanadium, 1000 A. units to 1500 A. units in thickness is disposed on the silicon oxide layer. A layer of gold, 6000 A. units to 20000 A. units in thickness is disposed on the layer of manganese, titanium or vanadium. A layer of hard solder joins the electrical conducting means to the layer of gold of the region to be contacted.

BACKGROUND OF THE INVENTION

Field of invention

This invention relates to electrical devices embodying electrical conducting means joined to a semiconductor element by means of hard solder alloys.

Description of the prior art

The operational life of a soft soldered electrical device is limited by the ability of soft solder joints to resist rupturing due to fatigue resulting from cyclic thermal stresses. Hard solder joints exhibit a better ability to resits rupture but presently available hard solder alloys do not wet the surfaces of silicon semiconductor material without alloying to them.

Prior art teachings disclose a method whereby a layer of oxide up to 50 A. in thickness is first formed on the surface of a silicon wafer. Subsequently a layer of titanium followed by a layer of electrically conducting metal is disposed on the oxide layer. However, during thermal cycling of the device, electrical leads hard soldered to such a prepared silicon wafer separate from the wafer resulting in a malfunction and a shortened operational life expectancy for the electrical device.

SUMMARY OF THE INVENTION

In accordance with the teachings of this invention there is provided a semiconductor element comprising a body of silicon semiconductor material having at least two regions of different type semiconductivity and at least two opposed major surfaces, one of the regions of different type semiconductivity including at least a portion of one of the two opposed major surfaces, and the second of the regions of different type semiconductivity including at least a portion of the other of the two opposed major surfaces; a p-n junction formed at the interface of the two regions of different type semiconductivity; a first layer of silicon oxide disposed on at least a portion of each region comprising a portion of each of the two major opposed surfaces; a second layer of a material selected from the group consisting of manganese, titanium and vanadium disposed on at least a portion of the first layer of silicon oxide; a third layer of gold disposed on the layer of manganese, titanium or vanadium; electrical conducting means affixed to each of the regions; and a layer of hard solder alloy joining the electrical conducting means to each of the regions.

An object of this invention is to provide a silicon semiconductor element wherein the surface of the element to which electrical conducting means are hard soldered consists of a first layer of silicon oxide, 100 A. units to 150 A. units in thickness, a second layer of a material selected from the group consisting of manganese, titanium and vanadium, 1000 A. to 1500 A. in thickness, disposed on the first layer, and a layer of gold disposed on the second layer.

Other objects of this invention will in part be obvious and will, in part, appear hereinafter.

DRAWINGS

Figure 3:
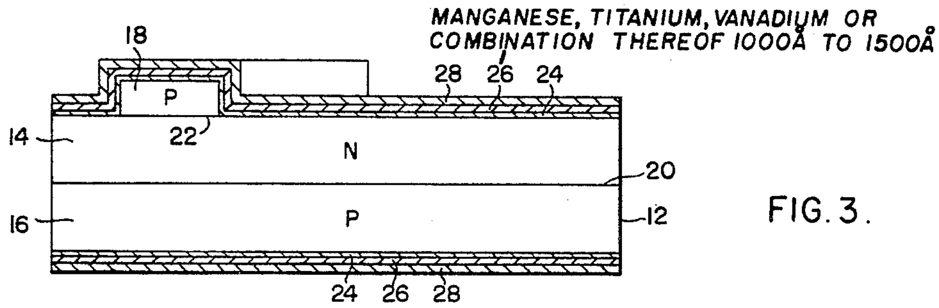
Figure 4:
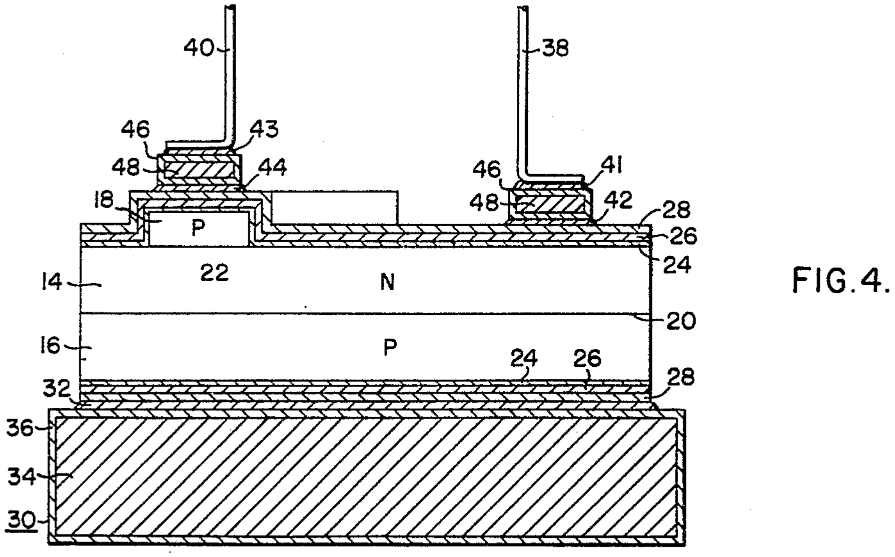
Figure 5:
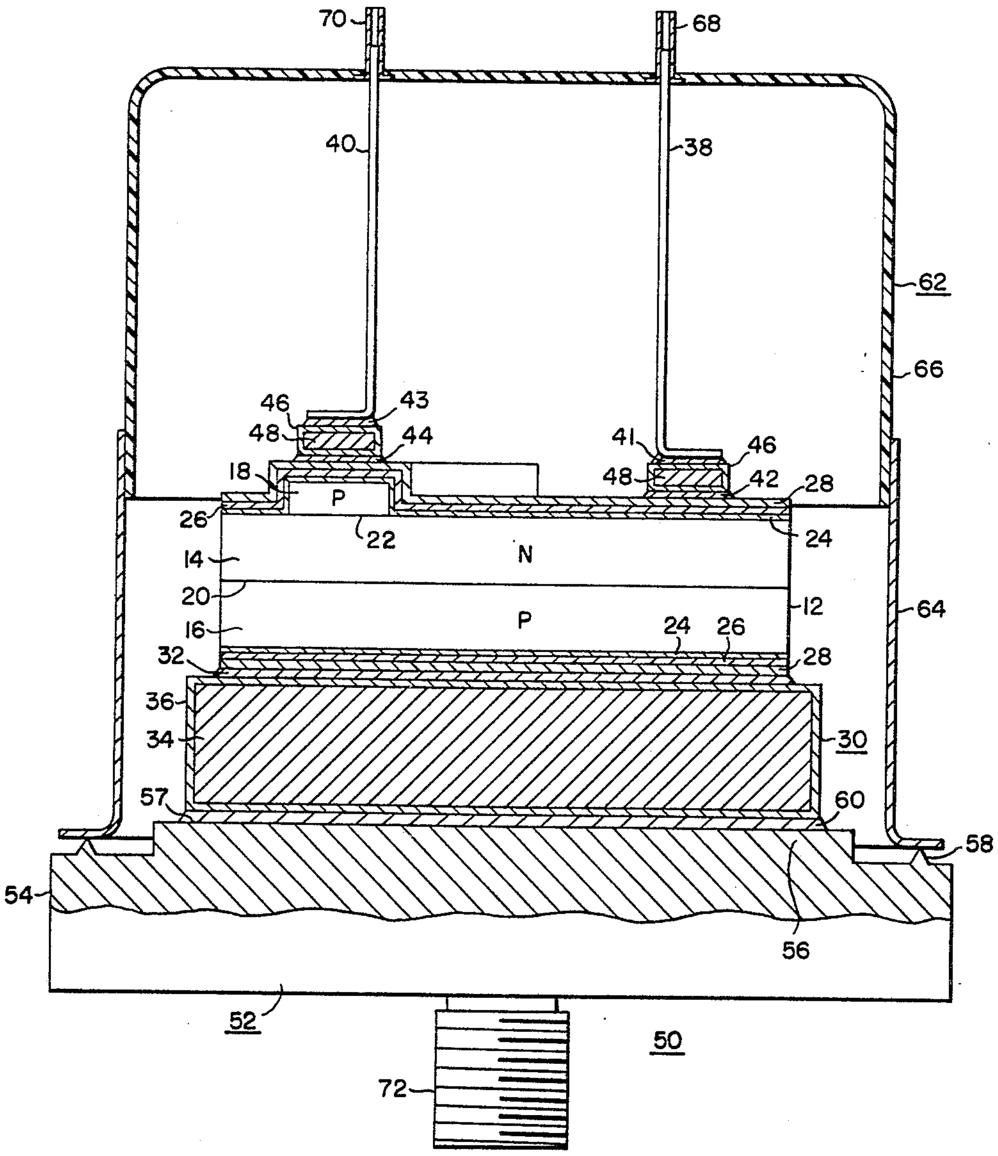

In order to more fully understand the nature and objects of this invention, reference should be had to the following drawings, in which:

FIGS. 1 through 4 is a view, partly in cross-section, of a body of silicon semiconductor material being processed in accordance with the teachings of this invention; and FIG. 5 is a view, partly in cross-section, of an electrical device made in accordance with the teachings of this invention.

DESCRIPTION OF THE INVENTION

Figure 1:
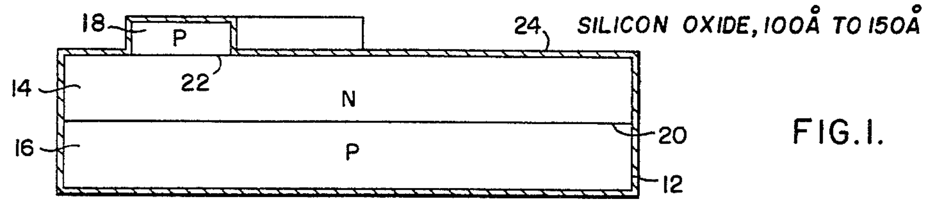

With reference to FIG. 1, there is shown a body 12 of silicon semiconductor material having three regions of semiconductivity. The body 12 has a first region 14 of first type semiconductivity and two regions 16 and 18 of second type semiconductivity. A first p-n junction 20 is formed at the interface between regions 14 and 16 and a second p-n junction 22 is formed at the interface between regions 14 and 18. The body 12 may have only two regions of semiconductivity but, in order to better describe the invention, and for no other reason, the body 12 is described as having three regions of semiconductivity.

A layer 24 of silicon oxide is formed over the entire exposed surface of the body 12 by any suitable means known to those skilled in the art. The layer 24 is from 100 to 150 A. in thickness. It has been found that if the layer 24 is less than 100 A. in thickness, the electrical contact metal subsequently deposited on the layer 24 has a tendency to peel off the surfaces during thermal cycling of the body 12. In instances where the layer 24 is 50 A. or less, the tendency of the electrical contact metal to peel away from the body 12 is increased greatly during thermal cycling of the body 12. On the other hand if the layer 24 of silicon oxide is greater than 150 A. then an electrical insulating region may occur which interferes with, and may even prevent, the electrical conduction between the body 12 and electrical contact metal subsequently deposited on the layer 24.

Preferably the layer 24 is formed by placing the body 12 in boiling concentrated nitric acid for a period of from 10 to 15 minutes. This interval of time is usually sufficient to form the layer 24 of silicon oxide within the thickness range of from 100 A. to 150 A.

Figure 2:
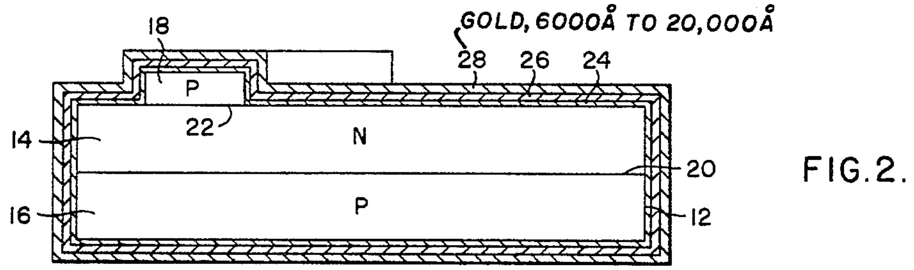

Referring now to FIG. 2, the body 12 is placed in a vacuum evaporation chamber and a layer 26 of either manganese, titanium or vanadium deposited on the top surface and most of the sides of the body 12. The layer 26 is preferably from 1000 A. to 1500 A. in thickness. If the layer 26 is less than 1000 A., the manganese, or titanium, or vanadium, may fail to adhere to the silicon oxide and will instead peel away from the surface of body 12 during normal operating conditions. However, should the layer 26 exceed 1500 A. in thickness, the total electrical resistance of the layer 26 increases, thereby increasing the saturation voltage accordingly which in turn generates increasing quantities of heat which must be dissipated and which also lowers the efficiency of the element. The layer 26 forms a barrier to prevent alloying of the body 12 by solder alloys during subsequent joining operations. A layer 28 of gold, preferably no less than 6000 A. and no greater than 20,000 A. in thickness, is then vacuum deposited on the layer 26.

The vacuum is then broken, the body 12 turned over and the vacuum deposition of first manganese, or titanium, or vanadium and then gold is repeated essentially establishing a single layer 26 of manganese, or titanium, or vanadium and a single layer 28 of gold encompassing the body 12.

With reference to FIG. 3, a suitable photosensitive masking material is applied on all the surfaces of the layer 28. The preferred design of the electrical contact to the region 18 as well as to the regions 14 and 16 is laid out on the top surface of the layer 28. The photoresist material with the overlay of the electrical contact designs is then exposed to light in a manner similar to that which one would employ to make a print from a photograph negative. The light source hardens the photosensitive masking material in those areas which will protect the layer 28 of gold beneath them. The unhardened photosensitive material is washed away to expose all but the selected areas of the surface of the layer 26 which form the respective electrical contact designs. Employing suitable etchants all of the unwanted portions of the layers 28, 26 and 24 are progressively chemically etched away resulting in the final structure shown in FIG. 3.

Referring now to FIG. 4, the plated body 12 is joined to a backup electrode 30 by a suitable solder layer 32 comprising such, for example, as 80% Au-20% Sn alloy solder. The solder alloy of the layer 32 is commonly referred to as a "hard solder," that is, a solder whose tensile strength and endurance limit is above 10,000 p.s.i.

The electrode 30 comprises a body 34 of a material selected from the group consisting of molybdenum, tungsten, tantalum combinations and base alloys thereof. A layer 36 of gold is disposed on at least the surface of the electrode 30 joined to the plated body 12. Preferably, the entire electrode 30 is plated with a layer 36 of gold. Alternately, a layer of nickel (not shown) may be disposed on the surface of the body 34 beneath the layer of gold 36.

Electrical leads 38 and 40, comprising a material such, for example, as silver, are each joined to a gold layer 46 encompassing a molybdenum electrical contact 48, each of which is in turn joined to the gold layer 28 of the electrical contact of the respective regions 14 and 18 by respective layers 41, 42, 43 and 44 of a "hard" solder. A suitable hard solder is the same alloy previously employed, an 80% Au-20% Sn. To facilitate the assembly of leads 38 and 40 they may be pretinned with the same solder alloys.

Referring now to FIG. 5, there is shown an electrical device 50 embodying the plated body 12 of FIG. 4. The device 50 comprises a good electrically and thermally conductive support member 52. The support member 52 is comprised of a peripheral flange 54 and an upwardly extending pedestal portion 56. The pedestal portion 56 has an uppermost mounting surface 57. The peripheral flange 54 has an integral weld ring 58.

The support member 52 is made of a metal selected from the group consisting of copper, silver, aluminum, base alloys thereof, and ferrous base alloys. Copper and brass, a base alloy of copper, have been found particularly satisfactory for this purpose.

The plated electrode 30, with the plated body 12 affixed thereto, is joined to the surface 58 of the pedestal portion 56 by a layer 60 of a suitable hard solder, such, for example, as 80% Au-20% Sn solder alloy.

A header assembly 62 joined to the member 52 hermetically seals the plated body 12 of semiconductor material from the surrounding ambient. The header assembly 62 comprises an outwardly extending flanged member 64 affixed to an apertured electrically insulating seal member 66, a first metallic tube 68, and a second metallic tube 70. The header assembly 62 is joined to the member 52 by welding the outwardly extending flanged member 64 to the weld ring 58.

The electrical lead 38 passes upwardly through a portion of the first metallic tube 68 and is sealed therein by a suitable means such, for example, as by crimping. The electrical lead 40 passes upwardly through a portion of the second metallic tube 70 and is sealed therein by a suitable means such, for example, as by crimping, thereby completing the hermetic sealing of the plated body 12. The tubes 68 and 70 provide an electrical connecting means between the respective regions 14 and 18 and an electrical circuit external to the device 50.

The device 50 has a threaded portion 72 for assembling the device 50 into electrical apparatus. The threaded portion 72 may be an integral part of the member 52 or it may be affixed to the member 52 by suitable means, such, for example, as by brazing.

The following examples are illustrative of the teachings of this invention:

Example I

A body 12 of silicon semiconductor material was lapped and cleaned, exposed to air for 24 hours. A first layer 26 consisting of manganese approximately 1500 A. in thickness was deposited on the oxidized body 12 of silicon in a vacuum evaporation chamber. A second layer 28 consisting of gold having a thickness of 6000 A. was vacuum deposited on the first layer 26 of manganese in a vacuum evaporation chamber. The gold plated body was soldered to a gold plated molybdenum backup electrode 34 by an alloy solder comprising 80% Au-20% Sn. Two silver electrical leads 38 and 40 were pretinned with an 80% Au-20% Sn solder alloy and hard soldered to the gold plated body employing the same 80% Au-20% Sn solder.

The assembly was thermally cycled eight times from room temperature to 250° C. and back to room temperature again. After thermal cycling, the electric leads 38 and 40 and the backup electrode 34 had separated from the body of silicon peeling the manganese and gold from the body.

Example II

After lapping and cleaning, two bodies 12 of silicon semiconductor material were placed in boiling concentrated nitric acid where they remained for fifteen minutes. The bodies 12 were then removed from the boiling concentrated nitric acid, rinsed and cleaned. One body 12 was examined and it was found that a layer 24 of silicon oxide approximately 150 A. in thickness had been formed on the body.

A layer 24 of manganese 1000 A. in thickness was vacuum deposited onto the oxidized surface of the second body 12 of silicon. A layer 28 of gold 7000 A. in thickness was then vacuum deposited onto the layer 26 of manganese. The plated body 12 of silicon was then hard soldered with an 80% Au-20% Sn solder alloy to a gold plated molybdenum backup electrode 34. Two electrical leads 38 and 40 were pretinned with an alloy of 80% Au-20% Sn and then hard soldered to the plated body 12 of silicon.

The assembly was then thermally cycled: 500 w. for 5 msec., 3× per sec. for 15 days (1,200,000 cycles). Upon examination none of the metals had peeled from the surface of the body of silicon semiconductor material. The body was still joined physically to the backup electrode with no signs of separation occurring at any place between them. The electrical leads were also well bonded physically to the body of silicon. In contrast, soft solder devices usually fail after 100,000 cycles.

From the cited examples it is seen that the oxide layer formed on the body of silicon semiconductor material by mere exposure to the ambient for 24 hours is insufficient for hard soldered semiconductor devices which during normal operation are thermally cycled from room temperature to approximately 250° C. and back to room temperature. The utilization of a silicon oxide layer 100 A. units to 150 A. units in thickness enables one to fabricate hard soldered semiconductor devices in which the hard soldered joints will not rupture because of cyclic thermal stress.

While the invention has been described with reference to particular embodiments and examples, it will be understood, of course, that modifications, substitutions and the like may be made therein without departing from its scope.

I claim as my invention:

1. A semiconductor element comprising (1) a body of silicon semiconductor material having at least two regions of different type semiconductivity, a p-n junction between each pair of regions of opposite type semiconductivity and at least two opposed major surfaces, one of said regions of different type semiconductivity including at least a portion of one of said two opposed major surfaces, and another of said regions of different type semiconductivity including at least a portion of the other of said opposed major surfaces:

(2) a first layer of silicon oxide disposed on at least a portion of each region comprising a portion of each of the two major opposed surfaces;

(3) a second layer of a material selected from the group consisting of manganese, titanium and vanadium disposed on at least a portion of said first layer of silicon oxide;

(4) a third layer of gold disposed on the said second layer;

(5) electrical conducting means affixed to the gold plated surface of each of said regions; and (6) a layer of hard solder joining said electrical conducting means to the gold plated surface to which it is joined.

2. The semiconductor element of claim 1 in which the layer of silicon oxide is from 100 A. to 150 A. in thickness.

3. The semiconductor element of claim 2 in which the second layer is from 1000 A. to 1500 A. in thickness.

4. The semiconductor element of claim 3 in which said electrical conducting means comprises a body of a material selected from a group consisting of molybdenum, tungsten, tantalum and combinations and base alloys thereof, and a layer of gold disposed on at least that surface of said electrical contact joined by said layer of hard solder to said body of silicon.

References Cited

UNITED STATES PATENTS

| | | | |
|---|---|---|---|
| 2,899,344 | 8/1959 | Atalla et al. | 148—1.5 |
| 3,290,127 | 12/1966 | Kahng et al. | 29—195 |
| 3,290,570 | 12/1966 | Cunningham et al. | 317—240 |
| 3,375,417 | 3/1968 | Hull et al. | 317—234 |

JOHN W. HUCKERT, Primary Examiner

S. BRODER, Assistant Examiner

U.S. Cl. X.R.

317—235